United States Patent [19]

Koch et al.

[11] Patent Number: 5,299,212
[45] Date of Patent: Mar. 29, 1994

[54] ARTICLE COMPRISING A WAVELENGTH-STABILIZED SEMICONDUCTOR LASER

[75] Inventors: Thomas L. Koch, Holmdel; Sheryl L. Woodward, Lincroft, both of N.J.

[73] Assignee: AT&T Bell Laboratories, Murray Hill, N.J.

[21] Appl. No.: 28,881

[22] Filed: Mar. 10, 1993

[51] Int. Cl.⁵ .................. H01S 3/137; H01S 3/10; H01S 3/133

[52] U.S. Cl. ........................... 372/32; 372/20; 372/43

[58] Field of Search ............. 372/20, 32, 29, 6, 102, 372/96, 43

[56] References Cited

U.S. PATENT DOCUMENTS

| | | | |
|---|---|---|---|
| 4,815,081 | 3/1989 | Mahlein et al. | 372/32 |
| 5,042,042 | 8/1991 | Hori et al. | 372/32 |
| 5,077,816 | 12/1991 | Glomb et al. | 385/37 |
| 5,185,643 | 2/1993 | Vry et al. | 372/32 |
| 5,208,819 | 5/1993 | Huber | 372/32 |

OTHER PUBLICATIONS

"Method for Setting the Absolute Frequency of a Tunable, 1.5 micron Two-Section DBR Laser", C. R. Giles, et al., *IEEE Photonics Technology Letters*, vol. 2, No. 1, Jan. 1990, pp. 63–65.

"Formation of Bragg gratings in optical fibers by a transverse holographic method", G. Meltz, *Optics Letters*, vol. 14, No. 15, Aug. 1, 1989, pp. 823–825.

"A Control Loop Which Ensures High Side-Mode-Suppression Ratio in a Tunable DBR Laser", S. L. Woodward et al., *IEEE Photonics Technology Letters*, vol. 4, No. 5, May 1992, pp. 417–419.

"Strained layer multiple quantum well distributed Bragg reflector lasers with a fast monitoring photodiode", U. Koren et al., *Applied Physics Letters*, vol. 58, Mar. 1991, pp. 1239–1240.

"High Performance Tunable 1.5 micron InGaAs/InGAsP Multiple-Quantum-Well Distributed-Bragg-Reflector Lasers", T. L. Koch et al., Proceedings 11th IEEE International Semiconductor Laser Conference, 1988, pp. 120–122, No month available.

*Primary Examiner*—Rodney B. Bovernick
*Assistant Examiner*—Robert McNutt
*Attorney, Agent, or Firm*—Eugen E. Pacher

[57] ABSTRACT

The disclosed article comprises a semiconductor laser (typically a multi-segment DBR laser) and feedback means for controlling the laser wavelength. The wavelength reference element in the feedback means advantageously is an optical fiber comprising an in-line refractive index grating. Such gratings frequently have a transmission spectrum that exhibits subsidiary lobes, in addition to the desired main lobe, potentially compromising the "cold-start" ability of prior art systems. This and other drawbacks of prior art systems exemplarily are overcome by apparatus that comprises a feedback loop that comprises means for causing a current $I_B$ to flow to the "Bragg" section of a multi-segment DBR laser such that wavelength of the laser output is a function of $I_B$, and that further comprises means for changing the temperature of the laser in response to a change in the wavelength of the laser. Use of a wavelength reference element that has a relatively wide primary minimum facilitates cold starting. Exemplarily, the disclosed article is a wavelength division multiplexed (WDM) optical fiber communication system.

8 Claims, 2 Drawing Sheets

ARTICLE COMPRISING A WAVELENGTH-STABILIZED SEMICONDUCTOR LASER

FIELD OF THE INVENTION

This invention pertains to articles (e.g., wavelength division multiplexed optical fiber communication systems) that comprise a wavelength-stabilized laser radiation source.

BACKGROUND OF THE INVENTION

Wavelength division multiplexed (WDM) optical fiber communication systems are known. Such a system typically comprises wavelength reference means and feedback means that maintain the wavelength of the output radiation of a laser at a predetermined value.

Exemplarily, reference means comprise optical fiber with in-line refractive index grating. See, for instance, U.S. Pat. No. 5,077,816, which discloses a wavelength multiplexed fiber communication system that comprises a narrow band (e.g., 60 GHz tuning range) semiconductor laser and a narrow band (e.g., 44 GHz) refractive index reflection grating, with the feedback loop locking the laser output to the center frequency of the grating. See also C. R. Giles et al., *IEEE Photonics Technology Letters*, Vol. 2(1), p. 63, which discloses use of an Er-YAG optical filter, and use of a feedback loop to control the current to the Bragg section of a two-section DBR laser.

Some shortcomings are associated with prior art wavelength stabilization schemes. The scheme of the '816 patent involves use of a narrow band laser. However, it would frequently be desirable to be able to use lasers having a broad tuning range such that nominally identical (broad band) lasers could be used as sources in a WDM system, thus avoiding the need to use specially designed lasers for the various channels. The Giles et al. scheme typically does not provide access to all wavelengths within the tuning range of a (broad-band) laser. Such access typically would be desirable. The scheme of the '816 patent typically is not capable of start-up without human intervention ("cold-start") if the wavelength reference means (typically an in-line refractive index grating) does not have a single transmission minimum but exhibits also one or more subsidiary minima, as is frequently the case. It would clearly be desirable to have available a stabilization scheme that is capable of cold-start even under those circumstances. Finally, it would be desirable to have available a stabilization scheme that facilitates some choice in the control frequency, such that (typically unavoidable) small deviations from the target wavelength of the wavelength reference means can be readily compensated for. This application discloses an article that comprises a laser stabilization scheme that mitigates or eliminates at least some of the above recited shortcomings of the prior art schemes.

SUMMARY OF THE INVENTION

The invention is embodied in an article (e.g., a WDM optical communication system) that comprises a semiconductor laser and control means for maintaining the wavelength of the (typically single mode) radiation output of the laser substantially at a predetermined value. At least in preferred embodiments the laser is a broad band laser (tuning range typically greater than 4 nm), the control means allow accessing of substantially all wavelengths within the tuning range of the laser, and the control means can facilitate cold-start of the laser.

More particularly, the article comprises a semiconductor laser (exemplarily a multi-segment distributed Bragg reflector (DBR) laser), means for causing a first current to flow through the laser such that the laser has a radiation output, and means for changing the wavelength of the output. The article further comprises first optical waveguide (e.g., optical fiber) means that are adapted for receiving the output, and still further comprises means for maintaining the wavelength of the output substantially equal to a desired wavelength. These "control means" are connected to the means for changing the wavelength of the output and typically comprise second optical waveguide (e.g., also optical fiber) means that comprise an in-line refraction index grating and are connected to the first optical waveguide means such that a portion of the received radiation output is coupled from the first into the second waveguide means.

Significantly, the means for changing the output wavelength comprise means for causing a second electrical current to flow through the laser such that the wavelength of the laser output is a function of the second current, and further comprise means for changing the temperature of the laser.

In an exemplary preferred embodiment the article comprises means for providing an error signal that is the difference between a pre-selected reference signal ($V_{ref}$) and a signal that is proportional to the intensity of radiation transmitted through the in-line grating, means for varying the second current ($I_B$) until the error signal is equal to or below a preselected value, and means (exemplarily thermoelectric cooling means) for varying the temperature of the laser until the error signal is minimized. A control scheme according to the invention has maintained the wavelength of a tunable DBR laser constant to within ±0.1 Å, with the observed residual variations being largely due to temperature variation of the in-line grating.

Preferred embodiments of the invention comprise a control element having a relatively wide (e.g., ≧0.5 nm full width at half maximum) primary minimum. This offers several advantages over control schemes that require the use of an element having a very narrow primary minimum. For instance, the relatively wide minimum can be attained with a relatively short filter, making temperature control easier. The relatively wide minimum also facilitates compensation of (typically unavoidable) small departures from the center wavelength of the minimum. Finally, if a broadly tunable laser is used, it is easier to provide for cold-start capability if the width of the primary minimum is comparable to the wavelength step (exemplarily 1 nm in the below-described embodiment) per tuning step in $I_B$.

Although the discussion herein is primarily in terms of a control element having a transmission minimum, those skilled in the art will appreciate that the invention can also be practiced with a control element that has a transmission maximum at or near the wavelength of interest, and such embodiments are contemplated.

DETAILED DESCRIPTION OF A PREFERRED EMBODIMENT

Figure 1:
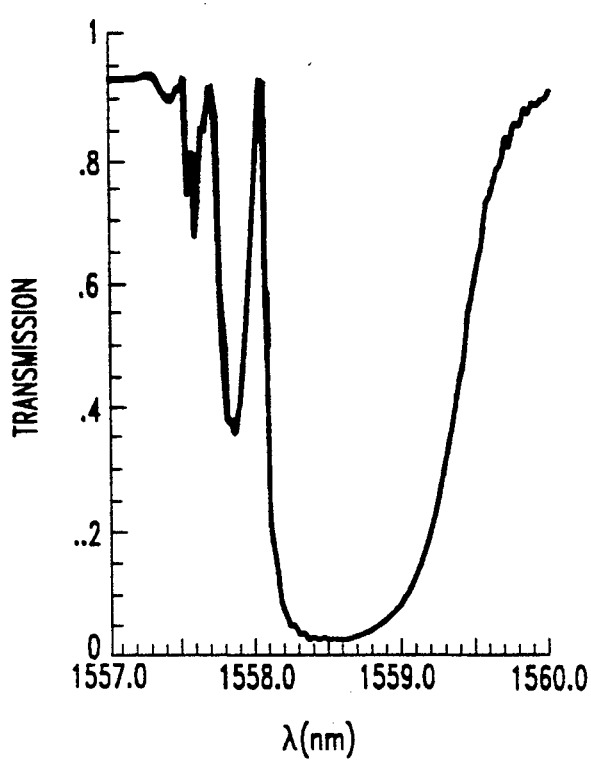
FIG. 1 shows transmission through an exemplary in-line refractive index grating as a function of wavelength.

FIG. 1 shows the transmission spectrum of a conventional in-line fiber refractive index grating, made conventionally by exposing a length of single mode optical fiber to a two-beam interference pattern. See, for instance, G. Meltz et al., *Optics Letters*, Vol. 14, p. 823. The Bragg band of the 2 mm long grating is centered at 1558.6 nm, with full-width-half-maximum of 1.3 nm. As can be readily seen, the grating has, in addition to the main lobe, several side lobes. These side lobes are, we believe, due to the background index variation of the grating, which in turn is due to the radial variation of the intensity in the laser beam used to "write" the grating. Side lobes are frequently present in the transmission spectra of conventional in-line fiber refractive index gratings, making the cold-start ability of at least some prior art wavelength stabilization schemes at best questionable.

Although the invention can be practiced with a variety of lasers, a preferred embodiment comprises a multi-segment DBR laser of the type described in U.Koren et al., *Applied Physics Letters*, Vol. 58, p. 1239, incorporated herein by reference. Briefly, such a laser comprises two individually addressable segments, an "active" segment and a "Bragg" segment, with the output power of the laser being substantially determined by the current ($I_A$) through the former, and the wavelength of the output being a function of the current ($I_B$) through the latter.

Figure 2:
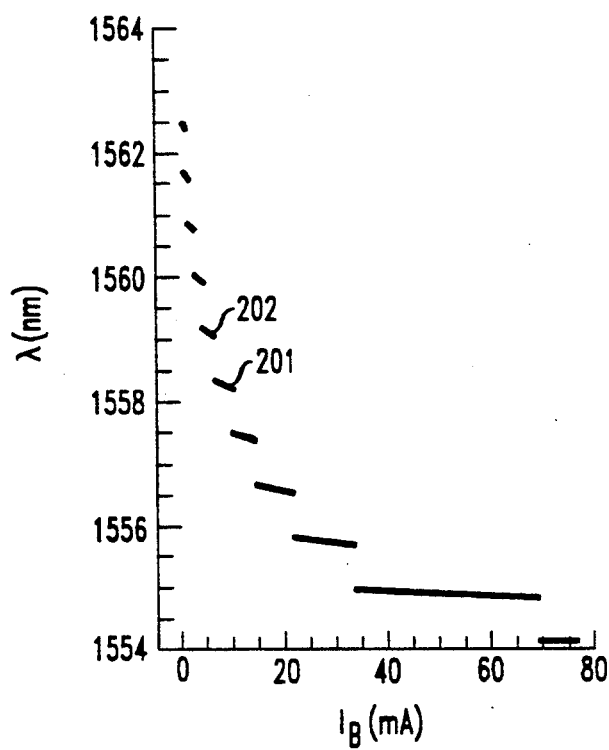
FIG. 2 shows output wavelength of an exemplary multi-segment DBR laser as a function of current ($I_B$) through the Bragg segment of the laser.

FIG. 2 shows the dependence of the wavelength on $I_B$, for constant $I_A$ and temperature, in an exemplary multi-segment DBR laser. As can be seen from FIG. 2, varying $I_B$ causes the laser to hop from mode to mode, with the gap between modes being 0.9 nm. Since the laser frequency varies by about 0.1 nm per °C. temperature change, all wavelengths within the exemplary laser's tuning range can be reached by adjusting the laser temperature within a temperature range less than ±5° C.

Figure 3:
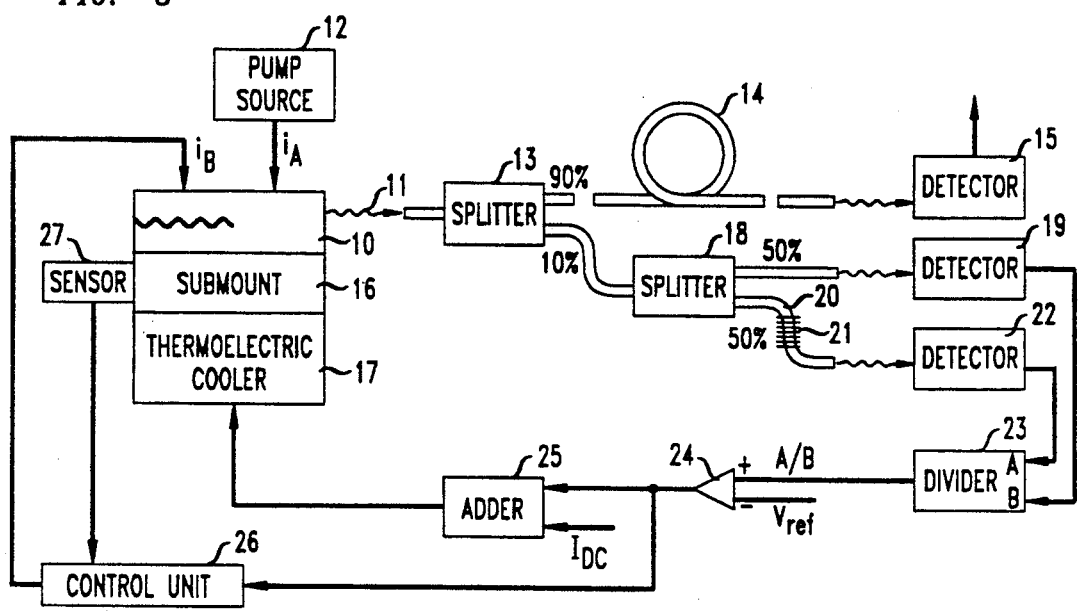
FIG. 3 schematically shows an exemplary article according to the invention, namely, an optical fiber communication system with laser wavelength control means.

FIG. 3 schematically depicts an exemplary article according to the invention, namely, a wavelength-stabilized optical fiber communication system. Multi-segment DBR laser 10 emits radiation 11 in response to current $I_A$ from pump source 12. The radiation is transmitted through a length of optical waveguide (typically a fiber) to conventional splitter 13 and divided in any desired ratio, e.g., 90%/10%, with one part (typically the larger one) transmitted through optical fiber 14 to detector 15. The laser is mounted on submount 16, exemplarily a block of copper, which in turn is attached to conventional thermoelectric cooling means 17.

The second output of coupler 13 is fed to (optional) conventional splitter 18 and divided into two (typically equal) parts, with one of the parts detected by conventional detector means 19. The other part is coupled into optical fiber 20 with in-line grating 21, with the transmitted power detected by conventional detector 22.

The electrical outputs of detectors 19 and 22 are provided to conventional divider 23, which normalizes the signal from detector 22 by dividing it by the signal from detector 19, which is directly proportional to the output intensity of laser 10. As those skilled in the art will recognize, there are other ways to normalize the signal from detector 22 (e.g., a back detector could provide an output that is proportional to the laser output intensity), and all such possibilities are contemplated.

The output (A/B) of divider 23 is provided to the +input of operational amplifier 24, and a predetermined DC voltage $V_{ref}$ is provided to the −input. The output of the operational amplifier is proportional to $(A/B) - V_{ref}$, as those skilled in the art will recognize. In conventional adder 25 a DC current $I_{DC}$ is added to the output of 24, and the output current of 25 is provided to thermoelectric cooler 17. The output of 24 is also provided to control unit 26 (optionally comprising a conventional programmed microprocessor). As those skilled in the art will recognize, the functions performed by control unit 26 are relatively simple and could optionally be performed by a simple circuit, exemplarily comprising a conventional comparator. Control unit 26 provides current $I_B$ to laser 10, and optionally receives an input signal from temperature sensor 27.

We will next describe the operation of the control loop of FIG. 3. Assume that the desired wavelength of operation of laser 10 is 1559.08 nm, and that the available in-line grating has the spectrum of FIG. 1. It will be noted that the center wavelength of the spectrum is 1558.5 nm and thus does not correspond exactly to the desired wavelength. The desired wavelength corresponds to about 10% transmission (T=0.1) through grating 21, and $V_{ref}$ is chosen such that the output of 24 (the "error signal") is essentially zero when signal A/B from divider 23 corresponds to T=0.1. This condition is met at two wavelengths, at the target wavelength 1559.08 nm and at about 1558.16 nm. Means for discriminating between the two wavelengths can be readily provided, as is further discussed below.

Desirably the control loop operates such that it does not respond to the presence of subsidiary lobes in the spectrum of the control element. Exemplarily, if the control element is the in-line grating of FIG. 1, this can be achieved if the loop only responds if signal A/B corresponds to a value less than that corresponding to T=0.35, the transmission associated with the main subsidiary lobe at 1557.8 nm. This can be readily accomplished by, e.g., ramping $I_B$ until signal A/B falls within a desired range of values, e.g., corresponds to T≤0.2, associated with wavelengths in the approximate range 1558.1–1559.2 nm. Advantageously this control band is selected such that at least one mode of the laser falls within the band. In the exemplary case, modes 201 and 202 (see FIG. 2) fall, respectively, completely and partially within the range.

Adder 25 provides to the thermoelectric cooler 17 a current that corresponds to the sum of an appropriately chosen current ($I_{DC}$) and the error signal, and the temperature of submount 16 (and thus of laser 10) is optionally monitored by temperature sensor 27. Typically $I_{DC}$ is selected such that, for zero error signal, the temperature of the laser is in a convenient range, e.g., 15°–25° C., and is optionally under control of unit 26.

With the signal A/B being in the control range, typically $I_B$ is maintained constant and the laser temperature is varied (exemplarily by varying $I_{DC}$). It is known that the laser wavelength typically increases with increasing laser temperature. This phenomenon not only is used in apparatus according to the invention to fine-tune the laser wavelength but it can also provide a means of assuring that the control loop locks on the desired wavelength (i.e., 1559.08 nm in the exemplary case) and not on the second wavelength at which the error signal is zero (i.e., about 1558.16 nm in the exemplary case). For instance, observing that the error signal is positive and decreasing with increasing temperature implies that the laser wavelength is less than 1558.16 nm in the exemplary case, and the coarse wavelength control needs to be adjusted further. An incremental decrease in $I_B$ can increase the wavelength to a value above the minimum in the transmission spectrum, with appropriate variation of the temperature resulting in nulling of the error signal, indicative of attainment of the desired wavelength. This procedure can readily and optionally be carried out under microprocessor control.

The above described procedure is exemplary only, and those skilled in the art will readily be able to devise other, equivalent procedures. For instance, in some cases it may be more desirable to use a temperature change rather than a change in $I_B$ to move the laser wavelength into the appropriate part of the control range. Furthermore, discrimination between desired and undesired lock-on wavelength could comprise determining the sign of the derivative of T with respect to Bragg current ($I_B$) or laser temperature. Electronic techniques for accomplishing this are well known. Exemplarily such techniques involve dithering the independent variable (e.g., $I_B$) around a set point, and measuring the resulting change in the dependent variable.

EXAMPLE

Wavelength control means as shown in FIG. 3 were implemented as follows. The laser was a DBR laser as described in S. L. Woodward et al., *IEEE Photonics Technology Letters*, Vol. 4(5), p. 417. The laser output was directed onto a conventional microscope objective, then passed through an optical isolator and a second microscope objective which focused the beam into a (commercially available) 90%/10% fiber optic coupler. In order to assess the performance of the control loop, the 90% output of the coupler was provided to a wavelength meter (Advantest TQ 8325). The 10% output of the coupler was provided to a (commercially available) 50%/50% optical coupler. One of the outputs of the coupler was directed into a length of optical fiber with the, previously described, in-line refractive index grating therein. The optical power transmitted through the grating, as well as the optical power from the other output of the coupler, was each measured by means of a HP 8152A optical average power meter. Commercially available analog processors (SRS 235) were used as divider 23 and as "operational amplifier" 24. The signal from 24 was amplified using a conventional power supply/amplifier (HP 6817A), with an identical unit providing $I_{DC}$. The control unit was a commercially available computer (AT&T 6386 with a National Instruments IEEE-488 instrumentation interface). The thermoelectric cooler also was conventional (Melcor CP1.4-11-01L). Currents $I_A$ and $I_B$ were provided by conventional DC power supplies (HP 6634A).

Figure 4:
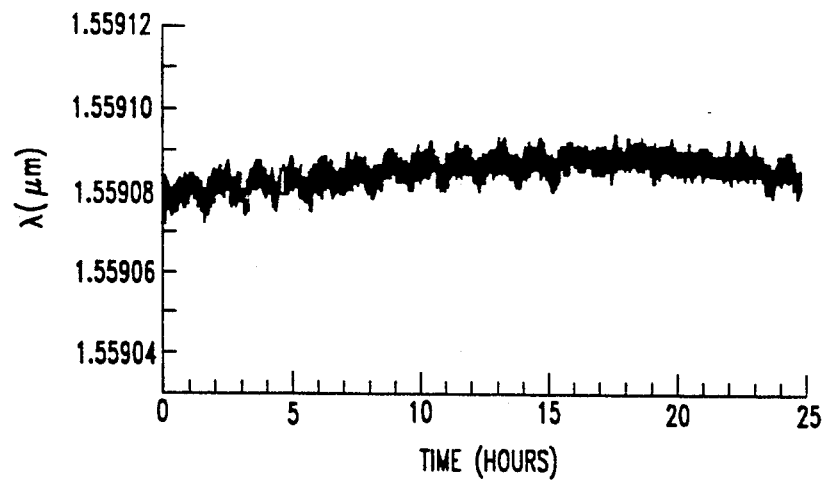
FIG. 4 shows exemplary data on laser wavelength as a function of time.

The Bragg current was programmed to ramp from 0–74 mA in 1 mA steps, stopping once T was in the range 0–0.2. When $I_B$ was 6 mA, the current ramp stopped. At that point the temperature-control loop adjusted the laser temperature such that the error signal was minimized. The performance of the control loop was monitored for the next 25 hours. The results are shown in FIG. 4. As shown, the laser wavelength varied from 1559.072 to 1559.094 nm. The variations were found to be due to temperature variation of the in-line grating (22.7°–24.1° C.), and could be substantially eliminated by temperature stabilization of the reference element.

Those skilled in the art will appreciate that the above described embodiment is exemplary only, and that the inventive scheme can be implemented in a variety of ways, including by means of one or more integrated circuits. They will further appreciate that lasers other than the above-recited one (e.g., a DBR laser with phase control section; see T. L. Koch et al., Proc. 11th IEEE International Semiconductor Laser Conference, 1988, p. 120) can be used in the practice of the invention.

We claim:
1. An article comprising
   a) a semiconductor laser and means for causing a first electrical current to flow through the laser such that the laser has a radiation output;
   b) means for changing the wavelength of said radiation output;
   c) first optical waveguide means adapted for receiving said radiation output; and
   d) means, connected to the means of b), for maintaining the wavelength of said radiation output substantially equal to a desired wavelength, said means comprising second optical waveguide means that comprise an in-line optical waveguide grating and are connected to said first optical waveguide means such that a portion of said received radiation output is coupled into the second optical waveguide means;

CHARACTERIZED IN THAT
   e) the means of b) comprise means for causing a second electrical current to flow through the laser such that the wavelength of the radiation output is a function of the second current, and further comprise means for changing the temperature of the laser, in response to a change in the wavelength of the laser.

2. An article according to claim 1, wherein the laser has a wavelength tuning range greater than 4 nm.

3. An article according to claim 2, wherein associated with said optical waveguide grating is a transmission spectrum having a primary minimum having full width at half maximum greater than 0.5 nm.

4. An article according to claim 3, wherein said transmission spectrum has at least one subsidiary minimum, and wherein said article is adapted for attaining laser emission at the desired wavelength without human intervention.

5. An article according to claim 1, wherein said first and second optical waveguide means comprise first and second optical fibers, respectively.

6. An article according to claim 5, wherein the article is an optical fiber communication system comprising transmitter means and receiver means, with optical fiber means signal transmissively connecting said transmitter and receiver means, the transmitter means comprising said semiconductor laser, and the optical fiber means comprising said first optical fiber.

7. An article according to claim 1, wherein said first and second optical waveguide means comprise a planar optical waveguide.

8. An article according to claim 1, wherein associated with said optical waveguide grating is a transmission spectrum having a maximum substantially at the desired wavelength.

* * * * *